United States Patent
Koido

(10) Patent No.: US 10,612,128 B2
(45) Date of Patent: Apr. 7, 2020

(54) SPUTTERING TARGET COMPRISING AL—TE—CU—ZR-BASED ALLOY AND METHOD OF MANUFACTURING SAME

(71) Applicant: JX Nippon Mining & Metals Corporation, Tokyo (JP)

(72) Inventor: Yoshimasa Koido, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 261 days.

(21) Appl. No.: 15/517,744

(22) PCT Filed: Oct. 8, 2015

(86) PCT No.: PCT/JP2015/078564
§ 371 (c)(1),
(2) Date: Apr. 7, 2017

(87) PCT Pub. No.: WO2016/056612
PCT Pub. Date: Apr. 14, 2016

(65) Prior Publication Data
US 2017/0306473 A1    Oct. 26, 2017

(30) Foreign Application Priority Data
Oct. 9, 2014    (JP) ................. 2014-207770

(51) Int. Cl.
| | |
|---|---|
| *C23C 14/34* | (2006.01) |
| *B22F 3/10* | (2006.01) |
| *C22C 28/00* | (2006.01) |
| *B22F 5/00* | (2006.01) |

(Continued)

(52) U.S. Cl.
CPC ............ *C23C 14/3414* (2013.01); *B22F 3/10* (2013.01); *B22F 3/14* (2013.01); *B22F 5/00* (2013.01); *C22C 1/04* (2013.01); *C22C 1/0416* (2013.01); *C22C 21/00* (2013.01); *C22C 28/00* (2013.01); *C22C 30/00* (2013.01); *C22C 30/02* (2013.01); *C23C 14/0623* (2013.01);
(Continued)

(58) Field of Classification Search
CPC .................................................. H01J 37/3426
See application file for complete search history.

(56) References Cited

U.S. PATENT DOCUMENTS

| | | | |
|---|---|---|---|
| 8,846,141 B1 * | 9/2014 | Robinson | ............ H01L 31/0322 427/189 |
| 2010/0055375 A1 * | 3/2010 | Sasa | .................... C23C 14/3414 428/64.4 |

(Continued)

FOREIGN PATENT DOCUMENTS

| | | |
|---|---|---|
| EP | 3124647 A1 | 2/2017 |
| JP | 2014-029026 A | 2/2014 |

(Continued)

*Primary Examiner* — Jason Berman
(74) *Attorney, Agent, or Firm* — Howson & Howson LLP

(57) ABSTRACT

A sputtering target containing 20 at % to 40 at % of Te, 5 at % to 20 at % of Cu, 5 at % to 15 at % of Zr, and remainder being Al, wherein a structure of the sputtering target is comprise of an Al phase, a Cu phase, a CuTeZr phase, a CuTe phase and a Zr phase. The present invention aims to provide an Al—Te—Cu—Zr-based alloy sputtering target capable of effectively suppressing the degradation of properties caused by compositional deviation, as well as a method of manufacturing the same.

12 Claims, 2 Drawing Sheets

(51) Int. Cl.
*C23C 14/06* (2006.01)
*C22C 1/04* (2006.01)
*B22F 3/14* (2006.01)
*C22C 30/00* (2006.01)
*H01J 37/34* (2006.01)
*C22C 21/00* (2006.01)
*C22C 30/02* (2006.01)
*C22F 1/00* (2006.01)

(52) U.S. Cl.
CPC ..... *H01J 37/3426* (2013.01); *B22F 2201/013* (2013.01); *B22F 2301/052* (2013.01); *B22F 2301/10* (2013.01); *B22F 2301/205* (2013.01); *B22F 2304/10* (2013.01); *B22F 2998/10* (2013.01); *B22F 2999/00* (2013.01); *C22F 1/00* (2013.01)

(56) References Cited

U.S. PATENT DOCUMENTS

| | | |
|---|---|---|
| 2011/0027597 A1 | 2/2011 | Ohba et al. |
| 2011/0140065 A1 | 6/2011 | Maesaka et al. |
| 2011/0155988 A1* | 6/2011 | Ohba .................. H01L 27/2436 257/2 |
| 2012/0145987 A1 | 6/2012 | Sei et al. |
| 2014/0151624 A1 | 6/2014 | Ohba et al. |

FOREIGN PATENT DOCUMENTS

| | | | | |
|---|---|---|---|---|
| JP | 2014029026 A | * | 2/2014 | ......... C23C 14/3414 |
| WO | 2013/035696 A1 | | 3/2013 | |

* cited by examiner

[Fig. 1]
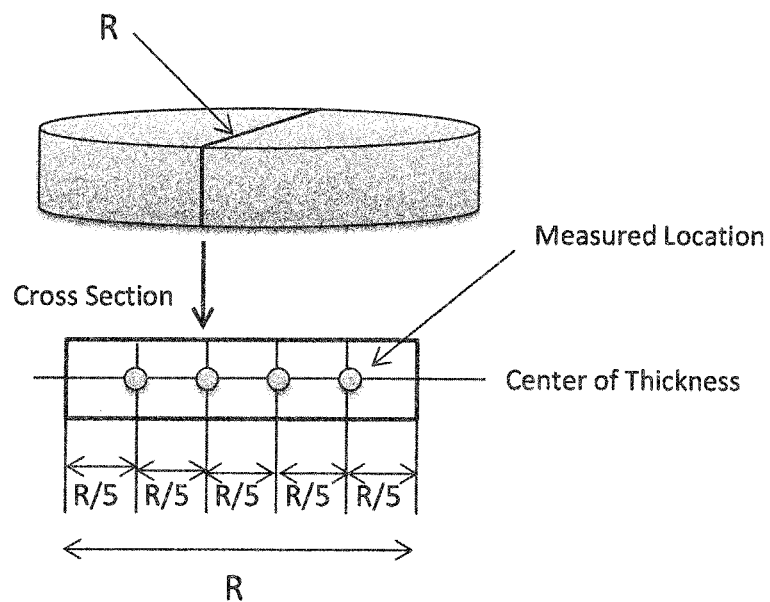
[Fig 2]
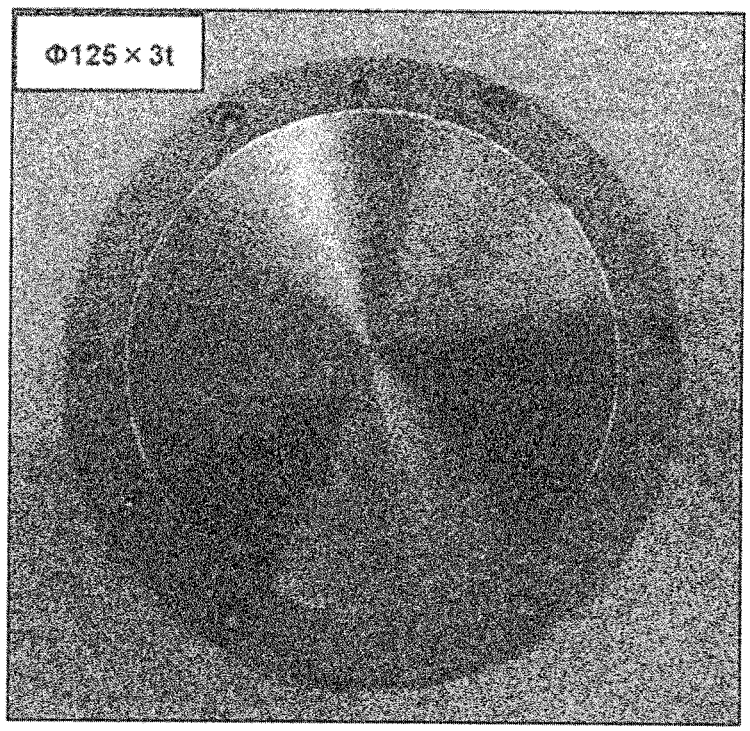

[Fig. 3]
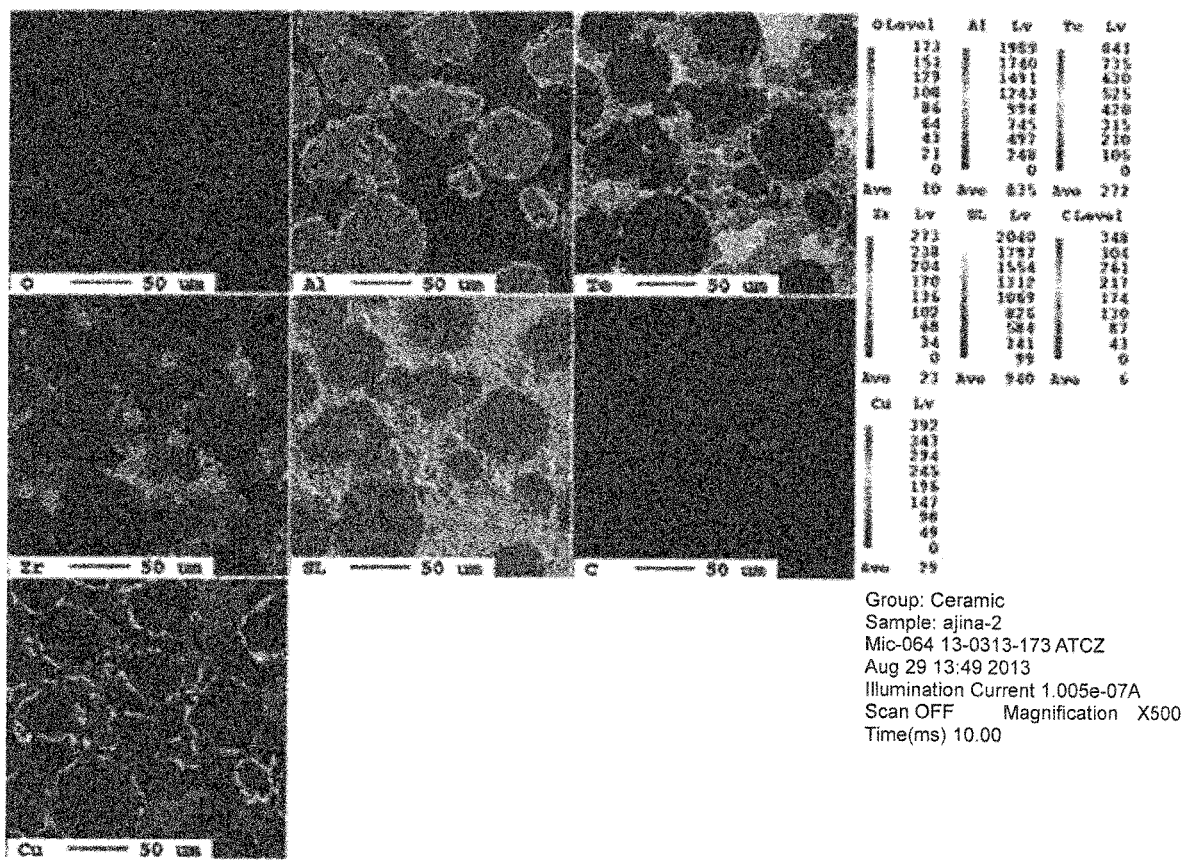

SPUTTERING TARGET COMPRISING AL—TE—CU—ZR-BASED ALLOY AND METHOD OF MANUFACTURING SAME

BACKGROUND

The present invention relates to a sputtering target comprised of an Al—Te—Cu—Zr-based alloy and a method of manufacturing the same, and in particular relates to an Al—Te—Cu—Zr-based alloy sputtering target for use in forming a thin film comprised of an Al—Te—Cu—Zr-based alloy, which is a resistive random access material, and to a method of manufacturing the same.

In recent years, thin films comprised of a Te—Al-based material or a Te—Zr-based material which record information by using resistance change are being used as a resistive random access recording material. As methods of forming thin films from the foregoing materials, normally adopted are the vacuum deposition method and the sputtering method which are generally referred to as physical deposition methods. In particular, thin films are often formed using the magnetron sputtering method in light of its operability and stability of deposition.

The formation of thin films via the sputtering method is performed by physically colliding positive ions, such as argon ions, with a target mounted on the cathode, and sputtering the material configuring the target based on the collision energy to laminate a film, which substantially has the same composition as the target material, on the substrate mounted on the cathode facing the target. Deposition via the sputtering method is characterized in that, by adjusting the treatment time and supplied power, it is possible to form thin films of angstrom units to thick films of several ten µm at a stable deposition rate.

As a Te—Al-based sputtering target, for example, Patent Document 1 discloses a target containing one or more types of high melting point metal elements selected from an element group of Ti, Zr, Hf, V, Nb, Ta, and lanthanoid elements, one or more types of elements selected from Al, Ge, Zn, Co, Cu, Ni, Fe, Si, Mg, and Ga, and one or more types of chalcogen elements selected from S, Se, and Te. Furthermore, Patent Document 1 discloses, as the method of manufacturing an AlCuGeTeZr target material, preparing an AlCuZr alloy ingot, thereafter pulverizing the alloy ingot to obtain an alloy powder, mixing the alloy powder with a Te powder and a Ge powder, and sintering the mixed powder.

When preparing a sintered body comprised of a multi-component-based alloy, the method of preliminarily synthesizing the structural components and using them as raw materials is often adopted. Nevertheless, in the case of manufacturing an Al—Te—Cu—Zr alloy, when Te—Zr are preliminarily synthesized, because the vapor pressure of Te is high, there is a problem in that a compositional deviation will arise in the liquid phase synthesis with Zr having a high melting point (vapor pressure of Te at 1000° C. is 100 kPa, while the vapor pressure of Zr is 1 kPa or less). Furthermore, when Al and Te are alloyed, there is a problem in that a highly active and difficult-to-handle Al—Te is generated.

Furthermore, when forming a Te—Al-based alloy film as a resistive random access recording material, there is a problem in that nodules are generated on the target surface during sputtering, and cause the generation of particles and arcing. In particular, since an Al—Te—Cu—Zr alloy target is comprised of multiple metal components with different deposition rates, there is a problem in that the frequency of generation of nodules is great, and the amount of generation of particles is also consequently great. And the problems with these types of targets and the sputtering of these targets are that they considerably deteriorate the quality of the thin film as a recording medium.

CITATION LIST

Patent Documents

Patent Document 1: JP 2011-026679 A

SUMMARY

An object of this present invention is to provide an Al—Te—Cu—Zr-based alloy sputtering target with minimal compositional deviation and which comprises the intended characteristics, as well as a method of manufacturing the same.

In order to achieve the foregoing object, as a result of intense study, the present inventors discovered that it is possible to manufacture an Al—Te—Cu—Zr-based alloy sputtering target with minimal compositional deviation of the sintered body relative to the raw material compounding ratio, and with minimal generation of particles, by devising the production method.

Based on the foregoing discovery, the present invention provides:
1) A sputtering target containing 20 at % to 40 at % of Te, 5 at % to 20 at % of Cu, 5 at % to 15 at % of Zr, and remainder being Al, wherein a structure of the sputtering target is comprised of an Al phase, a Cu phase, a CuTeZr phase, a CuTe phase and a Zr phase.
2) The sputtering target according to 1) above, wherein the sputtering target has an average grain size of 1 µm to 50 µm, and a maximum grain size of 100 µm or less.
3) The sputtering target according to 1) or 2) above, wherein the sputtering target has a purity of 3N or higher, and an oxygen content of 3000 wtppm or less.
4) The sputtering target according to any one of 1) to 3) above, wherein the sputtering target contains one or more elements selected among Si, C, Ti, Hf, V, Nb, Ta, lanthanoid elements, Ge, Zn, Co, Ni, Fe, Mg, Ga, S, and Se.
5) The sputtering target according to any one of 1) to 4) above, wherein the sputtering target has a relative density of 90% or more.

Furthermore, the present invention provides:
6) A method of manufacturing a sputtering target, wherein an Al raw material powder, a Te raw material powder, a Cu raw material powder, and a Zr raw material powder are weighed to achieve an intended composition, thereafter mixed, and an obtained mixed powder is subsequently sintered.
7) The method of manufacturing a sputtering target according to 6) above, wherein raw material powders having an average grain size of 1 µm to 50 µm and a maximum grain size of 100 µm or less are used.
8) The method of manufacturing a sputtering target according to 6) or 7) above, wherein sintering is performed at 300° C. to 380° C.
9) The method of manufacturing a sputtering target according to any one of 6) to 8) above, wherein sintering is performed in an argon atmosphere.

Since the Al—Te—Cu—Zr-based alloy sintered sputtering target of the present invention does not require any preliminary synthesis, compositional deviation caused by such synthesis is minimal, and it yields a superior effect of being able to suppress the degradation of properties caused by such compositional deviation.

BRIEF DESCRIPTION OF DRAWINGS

FIG. 1 is a diagram showing the measured locations of the grain size in the sputtering target.

FIG. 2 is an exterior photograph of the sputtering target of Example 1.

FIG. 3 is an element mapping of the sputtering target of Example 1 obtained by using FE-EPMA.

DETAILED DESCRIPTION

The Al—Te—Cu—Zr-based alloy sputtering target of the present invention contains 20 at % to 40 at % of Te, 5 at % to 20 at % of Cu, 5 at % to 15 at % of Zr, and remainder is Al. Each of these compositional ranges is set so as to obtain the properties as a resistive random access recording material.

Furthermore, the structure of the Al—Te—Cu—Zr-based alloy sputtering target of the present invention is comprised of an Al phase, a Cu phase, a CuTeZr phase, a CuTe phase and a Zr phase. These phases can be confirmed by observing the structure via EPMA. When a pure Te phase exists, since the sputter rate is high, there are problems in that a compositional deviation will arise, and nodules are generated. In addition, since Te has a high vapor pressure, it tends to generate holes in the target, and since Te has a low thermal conductivity, it tends to cause the target to accumulate heat and become cracked. Nevertheless, the foregoing problems can be resolved by causing Te to be an alloy phase with other metal elements as in the present invention.

The sputtering target of the present invention preferably has an average grain size of 1 μm or more 50 μm or less, and a maximum grain size of 100 μm or less. In the case of composite material configured from phases having different deposition rates, the undulations of the sputtering target surface can be reduced by reducing the crystal grain size, and the generation of nodules can also be consequently reduced. Note that, as described later, the crystal grain size of the sputtering target will vary considerably also based on the mixing method and sintering conditions, in addition to the adjustment of the grain size of the raw material powders.

Furthermore, the sputtering target of the present invention preferably has an oxygen content of 3000 wtppm or less. As a result of reducing the oxygen content to this level, it is possible to suppress the generation of particles caused by oxygen, as well as improve the device characteristics of a resistive random access memory and the like. Furthermore, since the existence of impurity elements will deteriorate the device characteristics, preferably, the purity of the sputtering target is set to be 3N (99.9%) or higher. However, the purity of the present invention is a purity excluding Ti and Hf, which are homologous elements with the constituent elements of the target and film and Zr, and gas components (C, O, N, H).

The sputtering target of the present invention contains Al, Te, Cu, and Zr as its main components, by other components may be added in order to adjust the device characteristics of a resistive random access memory and the like. For example, one or more types of elements selected from Si, C, Ti, Hf, V, Nb, Ta, lanthanoid elements, Ge, Zn, Co, Ni, Fe, Mg, Ga, S, and Se may be added. These additive elements can improve the device performance by being added, preferably, in an amount of 0.1 wt % to 5.0 wt %.

The sputtering target of the present invention preferably has a relative density of 90% or more. As a result of using this kind of dense target, it is possible to realize superior sputter characteristics. The relative density in the present invention can be calculated based on the following formula.

Relative density={(density of sintered body)/(theoretical density)}×100

However, the sintered body density is calculated by measuring the length (size) of the sintered body with a vernier micrometer, and performing the calculation based on the volume and measured weight thereof, and the theoretical density is obtained by multiplying the independent density of the raw materials by the mixing mass ratio, and totaling the obtained values as shown below.

Theoretical density=Σ{(theoretical density of each raw material×mixing ratio)+(theoretical density of each raw material×mixing ratio)+ . . . }

The Al—Te—Cu—Zr-based alloy sputtering target of the present invention may be manufactured, for instance, based on the following method.

Foremost, an Al raw material powder, a Te raw material powder, a Cu raw material powder, a Zr raw material powder, and, as needed, the raw material powders of the foregoing additive metals are prepared. What is particularly important in the present invention is that these raw material powders are not preliminarily synthesized, and are sintered as it is. While the preliminary synthesis of raw material powders yields the advantages of causing the materials to be of uniform quality, which enables the improvement of the uniformity of the film as well as the reduction of particles, as described above, there are problems in that certain raw materials become volatilized during the synthesizing process, and the handling of the synthesized alloy becomes difficult. Meanwhile, when the raw material powders are sintered without being synthesized, while there may be a problem in that the amount of particles tends to increase due to the existence of multiple phases, according to the present invention, the foregoing problem can be resolved by alloying pure Te based on reactive sintering.

These metal powders preferably have an average grain size of 1 μm to 50 μm, and a maximum grain size of 100 μm. As a result of using powders having the foregoing grain size, it is possible to reduce the amount of oxygen without deteriorating the density. In particular, when the average grain size is greater than 50 μm, there are cases where the powders are not uniformly dispersed.

Subsequently, the foregoing raw material powders are weighed to achieve the intended composition, and mildly mixed so that oxidation is not promoted. For the mixing process, a general powder mixer, an ultrasonic vibration sieve or the like may be used. When the mixing power is too strong, the raw material powders may become separated due to the differences in the grain size/differences in the specific gravity. Thus, when using a mixer, an operation speed that is low as possible is preferably adopted, and when using an ultrasonic vibration sieve, an operation frequency that is high as possible is preferably adopted. Furthermore, a mixing method that uses mediums, such as when using a ball mill or an attritor as the mixer, is undesirable since the powders will become pressure-bonded to the medium or the inner wall of the pot. In order to effectively prevent the oxidation of powders, the raw material powders are preferably mixed in a vacuum or an inert atmosphere. When it is not possible to perform the mixing process in a vacuum or an inert atmosphere, the oxygen content can be reduced by subsequently performing hydrogen reduction.

The thus obtained mixed powder is sintered in a vacuum atmosphere or an inert gas atmosphere. As the sintering method, various pressure sintering methods such as the hot press method, the plasma discharge sintering method, or the hot isostatic press sintering method may be adopted. Furthermore, it is also possible to sinter the molded compact, and thereafter mold the mixed powder. The holding temperature during sintering is preferably set to be within a temperature range of 300° C. to 380° C. When the holding temperature is less than 300° C., the density cannot be sufficiently increased, and there is concern in that particles or arcing may be generated during sputtering. Meanwhile, when the holding temperature exceeds 380° C., Te and Al, Zr will react and discharge an intense heat of reaction and melt the sintered body, and this is undesirable. Furthermore, since Te is an extremely volatile material, sintering is desirably performed in an inert gas (argon gas) atmosphere, rather than in a vacuum atmosphere, in order to prevent any unreasonable generation of gas.

The AlTeCuZr sintered body prepared based on the foregoing method, and the sintered body added with other components, are subject to machining such cutting and polishing as needed to prepare a sputtering target of a predetermined shape. It is thereby possible to manufacture the Al—Te—Cu—Zr-based alloy sputtering target of the present invention having the foregoing features.

Note that the grain size of the sintered body is measured based on the following method. Foremost, the cross section of the target is observed at four locations (see FIG. 1) at a 2000× visual field with a SEM (scanning electron microscope). Subsequently, the grain size is measured according to the evaluation method based on the cutting method of JIS G0551 in each visual field. The average value of the grain sizes of the four visual fields was calculated as the average grain size, and the maximum grain size among the four visual fields was calculated as the maximum grain size.

EXAMPLES

The present invention is now explained in detail with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1

An Al raw material powder having a purity of 4N (average grain size of 43 μm, and maximum grain size of 84 μm), a Te raw material powder having a purity of 5N (average grain size of 29 μm, and maximum grain size of 76 μm or less), a Cu raw material powder having a purity of 4N (average grain size of 45 μm, and maximum grain size of 96 μm), and a Zr raw material powder having a purity of 98% (average grain size of 13 μm, and maximum grain size of 42 μm or less) were weighed to achieve a composition of Al:Te:Cu:Zr=38:39:12:11 (at %). Subsequently, the weighed powder was premixed for 30 minutes at 2000 rpm with a rotary mixer, and subsequently mixed with an ultrasonic vibration sieve. The frequency of the ultrasonic waves was set to 35 kHz. The mixed powder removed from the ultrasonic vibration sieve was filled in a die, and sintered via hot press. The hot press conditions were as follows: argon atmosphere, holding temperature of 300° C., holding time of 4 hours and 30 minutes, and a surface pressure of 300 kg/cm$^2$ was applied from the start of temperature increase to the end of holding. After the end of holding, the resultant product was naturally cooled as is in the chamber.

The obtained sintered body was cut with a lathe into a shape having a diameter of 125 mm and a thickness of 3 mm to prepare a disk-shaped sputtering target. The exterior photograph of this sputtering target is shown in FIG. 2. As a result of measuring the grain size and density of this sputtering target, the average grain size was 16 μm, the maximum grain size was 70 μm, and the relative density was 90%. As a result of analysis, the purity was 3N or higher, and the oxygen concentration was 2700 wtppm.

Subsequently, the prepared sputtering target was mounted on a sputter device, and then sputtered. The sputtering conditions were input power of 1 kW and Ar gas pressure of 1.7 Pa, and a film was deposited on a silicon substrate for 20 seconds. As a result of measuring the particles that adhered to the substrate, the amount of particles was of a level that had no effect on the quality of the film. Furthermore, the structure of the target after sputtering was observed via EPMA. FIG. 2 shows the mapping image of EPMA. Based on FIG. 3, it was confirmed that the structure of the target is configured from an Al phase, a Cu phase, a CuTeZr phase, a CuTe phase, a TeZr phase, and a Zr phase. Furthermore, as a result of sputtering evaluation, the number of particles (0.4 μm or larger) was 86 particles, and the generation rate was extremely low.

Example 2

Other than changing the hot press temperature from 300° C. to 380° C., a sintered body was prepared under the same conditions as those of Example 1. Consequently, an Al—Te—Cu—Zr alloy sintered body having a purity of 3N or higher, an oxygen concentration of 2400 wtppm, a relative density of 99%, an average grain size of 29 μm, and a maximum grain size of 89 μm was obtained. Furthermore, it was confirmed that the sintered body structure is comprised of an Al phase, a Cu phase, a CuTeZr phase, a CuTe phase, a TeZr phase, and a Zr phase. Subsequently, as a result of sputtering the target obtained by machining this sintered body under the same conditions as those of Example 1, the number of particles (0.4 μm or larger) was 27 particles, and extremely few.

Example 3

Other than changing the composition ratio of Al, Te, Cu, and Zr as shown in Table 1, a sintered body was prepared under the same conditions as those of Example 1. Consequently, an Al—Te—Cu—Zr alloy sintered body having a purity of 3N or higher, an oxygen concentration of 2500 wtppm, a relative density of 99%, an average grain size of 21 μm, and a maximum grain size of 78 μm was obtained. Furthermore, it was confirmed that the sintered body structure is comprised of an Al phase, a Cu phase, a CuTeZr phase, a CuTe phase, a TeZr phase, and a Zr phase. Subsequently, as a result of sputtering the target obtained by machining this sintered body under the same conditions as those of Example 1, the number of particles (0.4 μm or larger) was 35 particles, and extremely few.

Example 4

Other than changing the composition ratio of Al, Te, Cu, and Zr as shown in Table 1, a sintered body was prepared under the same conditions as those of Example 1. Consequently, an Al—Te—Cu—Zr alloy sintered body having a purity of 3N or higher, an oxygen concentration of 2200 wtppm, a relative density of 99%, an average grain size of 34 μm, and a maximum grain size of 97 μm was obtained. Furthermore, it was confirmed that the sintered body structure is comprised of an Al phase, a Cu phase, a CuTeZr phase, a CuTe phase, a TeZr phase, and a Zr phase. Subsequently, as a result of sputtering the target obtained by machining this sintered body under the same conditions as those of Example 1, the number of particles (0.4 μm or larger) was 18 particles, and extremely few.

Example 5

Other than adding Si as an additive element to achieve the composition shown in Table 1, a sintered body was prepared under the same conditions as those of Example 1. Consequently, an Al—Te—Cu—Zr alloy sintered body having a purity of 3N or higher, an oxygen concentration of 1900 wtppm, a relative density of 97%, an average grain size of 25 μm, and a maximum grain size of 90 μm was obtained. Furthermore, it was confirmed that the sintered body structure is comprised of an Al phase, a Cu phase, a CuTeZr phase, a CuTe phase, a Si phase, a TeZr phase, and a Zr phase. Subsequently, as a result of sputtering the target obtained by machining this sintered body under the same conditions as those of Example 1, the number of particles (0.4 μm or larger) was 46 particles, and extremely few.

Example 6

Other than adding Ti as an additive element to achieve the composition shown in Table 1, a sintered body was prepared under the same conditions as those of Example 1. Consequently, an Al—Te—Cu—Zr alloy sintered body having a purity of 3N or higher, an oxygen concentration of 2900 wtppm, a relative density of 96%, an average grain size of 28 μm, and a maximum grain size of 91 μm was obtained. Furthermore, it was confirmed that the sintered body structure is comprised of an Al phase, a Cu phase, a CuTeZr phase, a CuTe phase, a Si phase, a TeZr phase, and a Zr phase. Subsequently, as a result of sputtering the target obtained by machining this sintered body under the same conditions as those of Example 1, the number of particles (0.4 μm or larger) was 31 particles, and extremely few.

Example 7

Other than adding Ge and C as additive elements to achieve the composition shown in Table 1, a sintered body was prepared under the same conditions as those of Example 1. Consequently, an Al—Te—Cu—Zr alloy sintered body having a purity of 3N or higher, an oxygen concentration of 2600 wtppm, a relative density of 93%, an average grain size of 30 μm, and a maximum grain size of 88 μm was obtained. Furthermore, it was confirmed that the sintered body structure is comprised of an Al phase, a Cu phase, a CuTeZr phase, a CuTe phase, a Ti phase, a TeZr phase, and a Zr phase. Subsequently, as a result of sputtering the target obtained by machining this sintered body under the same conditions as those of Example 1, the number of particles (0.4 μm or larger) was 62 particles, and extremely few.

Comparative Example 1

An Al raw material powder having a purity of 4N (average grain size of 43 μm, and maximum grain size of 84 μm), a Te raw material powder having a purity of 5N (average grain size of 29 μm, and maximum grain size of 76 μm or less), a Cu raw material powder having a purity of 4N (average grain size of 45 μm, and maximum grain size of 96 μm), and a Zr raw material powder having a purity of 98% (average grain size of 13 μm, and maximum grain size of 42 μm or less) were weighed to achieve a composition of Al:Te:Cu:Zr=65:10:3:22 (at %). Subsequently, the weighed powder was premixed for 30 minutes at 2000 rpm with a rotary mixer, and subsequently mixed with an ultrasonic vibration sieve. The frequency of the ultrasonic waves was set to 35 kHz. The mixed powder removed from the ultrasonic vibration sieve was filled in a die, and sintered via hot press. The hot press conditions were as follows: argon atmosphere, holding temperature of 300° C., holding time of 4 hours and 30 minutes, and a surface pressure of 300 kg/cm$^2$ was applied from the start of temperature increase to the end of holding. After the end of holding, the resultant product was naturally cooled as is in the chamber.

The obtained sintered body was cut with a lathe into a shape having a diameter of 125 mm and a thickness of 3 mm to prepare a disk-shaped sputtering target. As a result of measuring the grain size and density of this sputtering target, the average grain size was 18 μm, the maximum grain size was 72 μm, and the relative density was 99%. As a result of analysis, the purity was 3N or higher, and the oxygen concentration was 2800 wtppm.

Subsequently, the prepared sputtering target was mounted on a sputter device, and then sputtered. The sputtering conditions were input power of 1 kW and Ar gas pressure of 1.7 Pa, and a film was deposited on a silicon substrate for 20 seconds. As a result of measuring the particles that adhered to the substrate, the amount of particles was of a level that had no effect on the quality of the film was obtained. Furthermore, it was confirmed that the structure of the target is comprised of an Al phase, a Cu phase, a CuTeZr phase, a CuTe phase, a TeZr phase, and a Zr phase. Furthermore, as a result of sputtering evaluation, the number of particles (0.4 μm or larger) was 59 particles, and few. Nevertheless, with this kind of composition, it was not possible to obtain sufficient device characteristics.

Comparative Example 2

Other than changing the composition ratio of Al, Te, Cu, and Zr as shown in Table 1, a sintered body was prepared under the same conditions as those of Example 1. Consequently, an Al—Te—Cu—Zr alloy sintered body having a purity of 3N or higher, an oxygen concentration of 2700 wtppm, a relative density of 99%, an average grain size of 27 μm, and a maximum grain size of 92 μm was obtained. Furthermore, it was confirmed that the sintered body structure is comprised of an Al phase, a Cu phase, a CuTeZr phase, a CuTe phase, a TeZr phase, and a Zr phase. Subsequently, as a result of sputtering the target obtained by machining this sintered body under the same conditions as those of Example 1, the number of particles (0.4 μm or larger) was 43 particles, and few. Nevertheless, with this kind of composition, it was not possible to obtain sufficient device characteristics.

Comparative Example 3

Other than shortening the holding time during hot press to 1 hour, a sintered body was prepared under the same conditions as those of Example 1. Consequently, an Al—Te—Cu—Zr alloy sintered body having a purity of 3N or higher, an oxygen concentration of 2600 wtppm, a relative density of 99%, an average grain size of 19 μm, and a maximum grain size of 85 μm was obtained. Alloying was suppressed because the holding time was shortened, and the sintered body structured had changed and was comprised of an Al phase, a Cu phase, a Te phase, and a Zr phase. Subsequently, as a result of sputtering the target obtained by machining this sintered body under the same conditions as those of Example 1, a large amount of nodules was generated, and the number of particles (0.4 μm or larger) was 414 particles, and increased considerably.

Comparative Example 4

Other than prolonging the holding time during hot press to 8 hours, a sintered body was prepared under the same conditions as those of Example 1. Consequently, an Al—Te—Cu—Zr alloy sintered body having a purity of 3N or higher, an oxygen concentration of 2700 wtppm, a relative density of 99%, an average grain size of 55 μm, and a maximum grain size of 104 μm was obtained. Furthermore, it was confirmed that the sintered body structure is comprised of an Al phase, a Cu phase, a CuTeZr phase, a CuTe phase, a TeZr phase, and a Zr phase. Subsequently, as a result of sputtering the target obtained by machining this sintered body under the same conditions as those of Example 1, a large amount of nodules was generated, and the number of particles (0.4 μm or larger) was 285 particles, and increased considerably.

Comparative Example 5

Other than leaving the raw material powders in the atmosphere for 30 minutes, a sintered body was prepared under the same conditions as those of Example 1. Consequently, an Al—Te—Cu—Zr alloy sintered body having a purity of 3N or higher, an oxygen concentration of 3400 wtppm, a relative density of 99%, an average grain size of 55 μm, and a maximum grain size of 104 μm was obtained. Furthermore, it was confirmed that the sintered body structure is comprised of an Al phase, a Cu phase, a CuTeZr phase, a CuTe phase, a TeZr phase, and a Zr phase. Subsequently, as a result of sputtering the target obtained by machining this sintered body under the same conditions as those of Example 1, a large amount of arcing was generated with the oxides contained in the target as the origin, and the number of particles (0.4 μm or larger) was 970 particles, and increased considerably. In addition, because the oxygen content was great, it was not possible to obtain sufficient device characteristics.

Comparative Example 6

Other than lowering the hot press temperature to 280° C., a sintered body was prepared under the same conditions as those of Example 1. Consequently, the average grain size was 11 μm, and the maximum grain size was 53 μm. An Al—Te—Cu—Zr alloy sintered body having a purity of 3N or higher, an oxygen concentration of 2700 wtppm, and a relative density of 87% was obtained. Furthermore, it was confirmed that the sintered body structure is comprised of an Al phase, a Cu phase, a CuTeZr phase, a CuTe phase, a TeZr phase, and a Zr phase. Subsequently, as a result of sputtering the target obtained by machining this sintered body under the same conditions as those of Example 1, a large amount of nodules was generated, and the number of particles (0.4 μm or larger) was 340 particles, and increased considerably.

Comparative Example 7

Other than increasing the hot press temperature to 400° C., a sintered body was prepared under the same conditions as those of Example 1. Consequently, the average grain size was 42 μm, and the maximum grain size was 99 μm. Furthermore, because Te was volatilized during hot press, the relative density was 84%. Consequently, an Al—Te—Cu—Zr alloy sintered body having a purity of 3N or higher, and an oxygen concentration of 2600 wtppm was obtained. Furthermore, it was confirmed that the sintered body structure is comprised of an Al phase, a Cu phase, a CuTeZr phase, a CuTe phase, a TeZr phase, and a Zr phase. Subsequently, as a result of sputtering the target obtained by machining this sintered body under the same conditions as those of Example 1, a large amount of nodules was generated, and the number of particles (0.4 μm or larger) was 537 particles, and increased considerably.

Comparative Example 8

Other than changing the atmosphere during hot press from Ar to a vacuum, a sintered body was prepared under the same conditions as those of Example 1. Because Te was volatilized during hot press, the relative density was 88%. Consequently, an Al—Te—Cu—Zr alloy sintered body having a purity of 3N or higher, an oxygen concentration of 2700 wtppm, an average grain size of 33 μm, and a maximum grain size of 94 μm was obtained. Furthermore, it was confirmed that the sintered body structure is comprised of an Al phase, a Cu phase, a CuTeZr phase, a CuTe phase, a TeZr phase, and a Zr phase. Subsequently, as a result of sputtering the target obtained by machining this sintered body under the same conditions as those of Example 1, a large amount of nodules was generated, and the number of particles (0.4 μm or larger) was 276 particles, and increased considerably.

The foregoing results are summarized in Table 1.

TABLE 1

|  | Al/at % | Te/at % | Cu/at % | Zr/at % | Other/at % | Used raw material | Press top temperature (° C.) | Press atmosphere |
|---|---|---|---|---|---|---|---|---|
| Example 1 | 38 | 39 | 12 | 11 | — | Al + Te + Cu + Zr | 300° C. | Ar |
| Example 2 | 38 | 39 | 12 | 11 | — | Al + Te + Cu + Zr | 380° C. | Ar |
| Example 3 | 60 | 20 | 5 | 15 | — | Al + Te + Cu + Zr | 380° C. | Ar |
| Example 4 | 35 | 40 | 20 | 5 | — | Al + Te + Cu + Zr | 380° C. | Ar |
| Example 5 | 38 | 35 | 12 | 15 | Si/4 | Al + Te + Cu + Zr | 380° C. | Ar |
| Example 6 | 38 | 33 | 12 | 17 | Tl/6 | Al + Te + Cu + Zr | 380° C. | Ar |
| Example 7 | 35 | 34 | 10 | 11 | Ge/5, C/5 | Al + Te + Cu + Zr | 380° C. | Ar |
| Comparative Example 1 | 65 | 10 | 3 | 22 | — | Al + Te + Cu + Zr | 380° C. | Ar |

TABLE 1-continued

| | | | | | | | |
|---|---|---|---|---|---|---|---|
| Comparative Example 2 | 32 | 41 | 23 | 4 | — | Al + Te + Cu + Zr | 380° C. | Ar |
| Comparative Example 3 | 38 | 39 | 12 | 11 | — | Al + Te + Cu + Zr | 380° C. | Ar |
| Comparative Example 4 | 38 | 39 | 12 | 11 | — | Al + Te + Cu + Zr | 380° C. | Ar |
| Comparative Example 5 | 38 | 39 | 12 | 11 | — | Al + Te + Cu + Zr | 380° C. | Ar |
| Comparative Example 6 | 38 | 39 | 12 | 11 | — | Al + Te + Cu + Zr | 280° C. | Ar |
| Comparative Example 7 | 38 | 39 | 12 | 11 | — | Al + Te + Cu + Zr | 400° C. | Ar |
| Comparative Example 8 | 38 | 39 | 12 | 11 | — | Al + Te + Cu + Zr | 380° C. | Vac |

| | Purity | Relative density (%) | Oxygen concentration/ppm | Phase | Average grain size (μm) | Maximum grain size (μm) | Number of particles (≥0.4 um) |
|---|---|---|---|---|---|---|---|
| Example 1 | 3N | 90 | 2700 | Al, Cu, CuTe, CuTeZr, TeZr, Zr | 16 | 70 | 86 |
| Example 2 | 3N | 99 | 2400 | Al, Cu, CuTe, Te CuTeZr, TeZr, Zr | 29 | 89 | 27 |
| Example 3 | 3N | 99 | 2500 | Al, Cu, CuTe, Te CuTeZr, TeZr, Zr | 21 | 78 | 35 |
| Example 4 | 3N | 99 | 2200 | Al, Cu, CuTe, Te CuTeZr, TeZr, Zr | 34 | 97 | 18 |
| Example 5 | 3N | 97 | 1900 | Al, Cu, CuTe, CuTeZr, Si, TeZr, Zr | 25 | 90 | 46 |
| Example 6 | 3N | 96 | 2900 | Al, Cu, CuTe, CuTeZr, Tl, Zr | 28 | 91 | 31 |
| Example 7 | 3N | 93 | 2600 | Al, C, Cu, CuTe, CuTeZr, Ge, TeZr, Tl, Zr | 30 | 88 | 62 |
| Comparative Example 1 | 3N | 99 | 2800 | Al, Cu, CuTe, CuTeZr, TeZr, Zr | 18 | 72 | 59 (properties were NG) |
| Comparative Example 2 | 3N | 99 | 2700 | Al, Cu, CuTe, CuTeZr, TeZr, Zr | 27 | 92 | 43 (properties were NG) |
| Comparative Example 3 | 3N | 99 | 2600 | Al, Te, Cu, Zr | 19 | 85 | 414 |
| Comparative Example 4 | 3N | 99 | 2700 | Al, Cu, CuTe, CuTeZr, TeZr, Zr | 55 | 104 | 285 |
| Comparative Example 5 | 3N | 99 | 3400 | Al, Cu, CuTe, CuTeZr, TeZr, Zr | 26 | 90 | 970 (with arcing; film properts were also NG) |
| Comparative Example 6 | 3N | 87 | 2700 | Al, Cu, CuTe, CuTeZr, TeZr, Zr | 11 | 53 | 340 |
| Comparative Example 7 | 3N | 84 | 2600 | Al, Cu, CuTe, CuTeZr, TeZr, Zr | 42 | 99 | 537 |
| Comparative Example 8 | 3N | 88 | 2700 | Al, Cu, CuTe, CuTeZr, TeZr, Zr | 33 | 94 | 276 |

Since the Al—Te—Cu—Zr-based alloy sintered sputtering target of the present invention has minimal compositional deviation, it yields a superior effect of being able to suppress the degradation of properties caused by such compositional deviation. Accordingly, the present invention is effective for stably supplying a thin film comprised of an Al—Te-based alloy, which is a high quality resistive random access recording material.

The invention claimed is:

1. A sputtering target containing 20 at % to 40 at % of Te, 5 at % to 20 at % of Cu, 5 at % to 15 at % of Zr, and remainder being Al, wherein a structure of the sputtering target is configured from an Al phase, a Cu phase, a CuTeZr phase, a CuTe phase and a Zr phase.

2. The sputtering target according to claim 1, wherein the sputtering target has an average grain size of 1 μm to 50 μm, and a maximum grain size of 100 μm or less.

3. The sputtering target according to claim 2, wherein the sputtering target has a purity of 3N or higher, and an oxygen content of 3000 wtppm or less.

4. The sputtering target according to claim 3, wherein the sputtering target contains one or more elements selected among Si, C, Ti, Hf, V, Nb, Ta, lanthanoid elements, Ge, Zn, Co, Ni, Fe, Mg, Ga, S, and Se.

5. The sputtering target according to claim 4, wherein the sputtering target has a relative density of 90% or more.

6. A method of manufacturing a sputtering target, wherein an Al raw material powder, a Te raw material powder, a Cu raw material powder, and a Zr raw material powder are weighed to achieve an intended composition, thereafter mixed, and an obtained mixed powder is subsequently sintered at 300° C. to 380° C. to produce a sputtering target containing 20 at % to 40 at % of Te, 5 at % to 20 at % of Cu, 5 at % to 15 at % of Zr, and remainder being Al, wherein a structure of the sputtering target is configured from an Al phase, a Cu phase, a CuTeZr phase, a CuTe phase and a Zr phase.

7. The method of manufacturing a sputtering target according to claim 6, wherein raw material powders having an average grain size of 1 μm to 50 μm and a maximum grain size of 100 μm or less are used.

8. The method of manufacturing a sputtering target according to claim 7, wherein sintering is performed in an argon atmosphere.

9. The method of manufacturing a sputtering target according to claim 6, wherein sintering is performed in an argon atmosphere.

10. The sputtering target according to claim 1, wherein the sputtering target has a purity of 3N or higher, and an oxygen content of 3000 wtppm or less.

11. The sputtering target according to claim 1, wherein the sputtering target contains one or more elements selected among Si, C, Ti, Hf, V, Nb, Ta, lanthanoid elements, Ge, Zn, Co, Ni, Fe, Mg, Ga, S, and Se.

12. The sputtering target according to claim 1, wherein the sputtering target has a relative density of 90% or more.

* * * * *